US010373830B2

(12) United States Patent
El-Ghoroury et al.

(10) Patent No.: US 10,373,830 B2
(45) Date of Patent: Aug. 6, 2019

(54) APPARATUS AND METHODS TO REMOVE UNBONDED AREAS WITHIN BONDED SUBSTRATES USING LOCALIZED ELECTROMAGNETIC WAVE ANNEALING

(71) Applicant: Ostendo Technologies, Inc., Carlsbad, CA (US)

(72) Inventors: Hussein S. El-Ghoroury, Carlsbad, CA (US); Minghsuan Liu, San Marcos, CA (US); Kameshwar Yadavalli, Carlsbad, CA (US); Weilong Tang, Carlsbad, CA (US); Benjamin A. Haskell, Carlsbad, CA (US); Hailong Zhou, Los Angeles, CA (US)

(73) Assignee: Ostendo Technologies, Inc., Carlsbad, CA (US)

( * ) Notice: Subject to any disclaimer, the term of this patent is extended or adjusted under 35 U.S.C. 154(b) by 0 days.

(21) Appl. No.: 15/452,005

(22) Filed: Mar. 7, 2017

(65) Prior Publication Data

US 2017/0263457 A1    Sep. 14, 2017

Related U.S. Application Data

(60) Provisional application No. 62/305,454, filed on Mar. 8, 2016.

(51) Int. Cl.
*H01L 21/67* (2006.01)
*H01L 21/687* (2006.01)
(Continued)

(52) U.S. Cl.
CPC ............ *H01L 21/187* (2013.01); *H01L 21/26* (2013.01); *H01L 21/67115* (2013.01);
(Continued)

(58) Field of Classification Search
CPC ............ H01L 21/187; H01L 21/67115; H01L 21/76251; H01L 21/26
See application file for complete search history.

(56) References Cited

U.S. PATENT DOCUMENTS

| 4,939,101 A | * | 7/1990 | Black | H01L 21/2007 117/1 |
| 5,007,071 A | * | 4/1991 | Nakano | G01N 23/18 257/E21.088 |

(Continued)

FOREIGN PATENT DOCUMENTS

| JP | 2005-203596 | 7/2005 |
| TW | 200504819 | 2/2005 |

OTHER PUBLICATIONS

Written Opinion of the International Searching Authority, U.S. Patent & Trademark Office, for International application No. PCT/US17/21458, dated May 31, 2017, all pages.*
(Continued)

*Primary Examiner* — Victoria K. Hall
(74) *Attorney, Agent, or Firm* — Womble Bond Dickinson (US) LLP

(57) ABSTRACT

An electromagnetic wave irradiation apparatus and methods to bond unbonded areas in a bonded pair of substrates are disclosed. The unbonded areas between the substrates are eliminated by thermal activation in the unbonded areas induced by electromagnetic wave irradiation having a wavelength selected to effect a phonon or electron excitation. A first substrate of the bonded pair of substrates absorbs the electromagnetic radiation and a portion of a resulting thermal energy transfers to an interface of the bonded pair of substrates at the unbonded areas with sufficient flux to cause opposite sides the first and second substrates to interact and dehydrate to form a bond (e.g., Si—O—Si bond).

20 Claims, 6 Drawing Sheets

(51) Int. Cl.
  *H01L 21/66* (2006.01)
  *H01L 21/26* (2006.01)
  *H01L 21/18* (2006.01)
  *H01L 21/762* (2006.01)

(52) U.S. Cl.
  CPC .. *H01L 21/68764* (2013.01); *H01L 21/76251* (2013.01); *H01L 22/12* (2013.01)

(56) References Cited

U.S. PATENT DOCUMENTS

| | | | | |
|---|---|---|---|---|
| 5,451,547 | A * | 9/1995 | Himi | H01L 21/187 |
| | | | | 148/DIG. 12 |
| 6,455,398 | B1 | 9/2002 | Fonstad, Jr. et al. | |
| 7,335,996 | B2 | 2/2008 | Tong | |
| 7,387,944 | B2 | 6/2008 | Tong et al. | |
| 7,485,968 | B2 | 2/2009 | Enquist et al. | |
| 7,553,744 | B2 | 6/2009 | Tong et al. | |
| 7,622,324 | B2 | 11/2009 | Enquist et al. | |
| 10,083,854 | B2 * | 9/2018 | Wimplinger | H01L 21/2007 |
| 10,141,218 | B2 * | 11/2018 | Tong | B23K 20/02 |
| 10,166,749 | B2 * | 1/2019 | Suga | B23K 1/20 |
| 10,186,451 | B2 * | 1/2019 | Hachigo | H01L 21/76251 |
| 10,204,785 | B2 * | 2/2019 | Suga | B23K 20/00 |
| 2001/0014514 | A1 | 8/2001 | Geusic | |
| 2003/0071269 | A1 * | 4/2003 | Tseng | B81B 1/00 |
| | | | | 257/98 |
| 2003/0182794 | A1 | 10/2003 | Fonstad, Jr. et al. | |
| 2003/0186521 | A1 | 10/2003 | Kub et al. | |
| 2004/0157407 | A1 | 8/2004 | Tong et al. | |
| 2004/0235266 | A1 | 11/2004 | Tong | |
| 2005/0009246 | A1 | 1/2005 | Enquist et al. | |
| 2005/0053319 | A1 | 3/2005 | Doan | |
| 2005/0079712 | A1 | 4/2005 | Tong et al. | |
| 2006/0013270 | A1 * | 1/2006 | Yumoto | G01N 21/39 |
| | | | | 372/21 |
| 2006/0216904 | A1 | 9/2006 | Tong | |
| 2007/0037379 | A1 | 2/2007 | Enquist et al. | |
| 2007/0281484 | A1 | 12/2007 | Ishibashi et al. | |
| 2008/0006369 | A1 * | 1/2008 | Lim | C09J 5/02 |
| | | | | 156/308.6 |
| 2008/0063878 | A1 | 3/2008 | Tong et al. | |
| 2008/0187757 | A1 | 8/2008 | Tong | |
| 2009/0068831 | A1 | 3/2009 | Enquist et al. | |
| 2010/0304151 | A1 * | 12/2010 | Tuennermann | C03B 23/203 |
| | | | | 428/428 |
| 2011/0117726 | A1 | 5/2011 | Pinnington et al. | |
| 2011/0250423 | A1 * | 10/2011 | Fukasawa | B28D 5/04 |
| | | | | 428/220 |
| 2013/0299080 | A1 * | 11/2013 | Plach | H01L 21/187 |
| | | | | 156/272.6 |
| 2013/0344302 | A1 * | 12/2013 | Helie | B23K 26/0057 |
| | | | | 428/195.1 |
| 2014/0017877 | A1 * | 1/2014 | Plach | H01L 21/2007 |
| | | | | 438/455 |
| 2015/0235851 | A1 * | 8/2015 | Broekaart | H01L 21/187 |
| | | | | 156/308.2 |
| 2015/0380292 | A1 * | 12/2015 | Tachioka | B23K 26/0057 |
| | | | | 438/759 |

OTHER PUBLICATIONS

A. Plossl and G. Krauter, Wafer direct bonding: tailoring adhesion between brittle materials, 1999, Materials Science and Engineering R25, Reports: A Review Journal, pp. 1-88.*
Darmont, Arnaud, "Spectral Response of Silicon Image Sensors", downloaded from www.aphesa.com/downloads/download2.php?id= 1, Apr. 2009, pp. 1-13.
Kopperschmidt, P. et al., "High bond energy and thermomechanical stress in silicon on sapphire wafer bonding", Applied Physics Letters, vol. 70, No. 22, Jun. 2, 1997, pp. 2972-2974.
Leica Microsystems, "Multiphoton Microscopy", downloaded from https://w3.biosci.utexas.edu/pmc/webdocs/Multiphoton.pdf, Feb. 28, 2012, 59 pp. total.
Piston, David W. et al., "Multiphoton Microscopy, Fundamentals and Applications in Multiphoton Excitation Microscopy", downloaded from https://www.microscopyu.com/techniques/multi-photon/ multiphoton-microscopy, undated, 17 pp. total.
Ustione, A. et al. "A simple introduction to multiphoton microscopy", Journal of Microscopy, vol. 243, Pt. 3, 2011, pp. 221-226.
Wikipedia, "Light intensity", downloaded from https://en.wikipedia. org/wiki/Light_intensity, entered Nov. 24, 2009, last edit Feb. 11, 2018, 1 pp total.
"International Search Report and Written Opinion of the International Searching Authority dated May 31, 2017; International Application No. PCT/US2017/021458", May 31, 2017.
Chen, P. H. et al., "Amorphous Si/Au wafer bonding", Applied Physics Letters, 90, 2007, pp. 132120-1 to 132120-3.
Chuang, Ricky W. et al., "High-temperature non-eutectic indium-tin joints fabricated by a fluxless process", Thin Solid Films, 414, 2002, pp. 175-179.
Hou, M. M. et al., "Low Temperature Transient Liquid Phase (LTTLP) Bonding for Au/Cu and Cu/Cu Interconnections", Journal of Electronic Packaging, vol. 114, Dec. 1992, pp. 443-447.
Jang, Eun-Jung et al., "Effect of Wet Pretreatment on Interfacial Adhesion Energy of Cu—Cu Thermocompression Bond for 3D IC Packages", Journal of Electronic Materials, vol. 38, No. 12, 2009, pp. 2449-2454.
Kim, Jongsung et al., "Fluxless Sn—Ag bonding in vacuum using electroplated layers", Materials Science and Engineering A, 448, 2007, pp. 345-350.
Ko, Cheng-Ta et al., "Water-level bonding/stacking technology for 3D integration", Microelectronics Reliability, 50, 2010, pp. 481-488.
Lü, J.-Q. et al., "Stacked Chip-to-Chip Interconnections Using Wafer Bonding Technology with Dielectric Bonding Glues", Proceedings of the 2001 Interconnect Technology Conference, 2001, pp. 219-221.
Plobl, Andreas et al., "Wafer direct bonding: tailoring adhesion between brittle materials", Materials Science and Engineering, R25, 1999, pp. 1-88.
Tong, Q. Y. et al., "Semiconductor Wafer Bonding Science and Technology", Wiley, 1999, pp. 203-261.
Tong, Q.-Y. et al., "Room temperature SiO2/SiO2 covalent bonding", Applied Physics Letters, 89, 2006, pp. 042110-1 to 042110-3.
Wang, Pin J. et al., "Fluxless Bonding of Large Silicon Chips to Ceramic Packages Using Electroplated Eutectic Au/Sn/Au Structures", Journal of Electronic Materials, vol. 38, No. 10, 2009, pp. 2106-2111.
Wikipedia, "Frequency", Retrieved on Apr. 25, 2017 from https:// en.wikipedia.org/wiki/Frequency, Dec. 17, 2015, pp. 1-6.
Wikipedia, "Optical fiber", Retrieved on Apr. 25, 2017 from https:// en.wikipedia.org/wiki/Optical_fiber, Dec. 7, 2015, pp. 1-21.
Yu, Da-Quan et al., "The role of Ni buffer layer on high yield low temperature hermetic water bonding using In/Sn/Cu metallization", Applied Physics Letters, 94, 2009, pp. 034105-1 to 034105-3.

* cited by examiner

APPARATUS AND METHODS TO REMOVE UNBONDED AREAS WITHIN BONDED SUBSTRATES USING LOCALIZED ELECTROMAGNETIC WAVE ANNEALING

CROSS-REFERENCE TO RELATED APPLICATIONS

This application claims the benefit of U.S. Provisional Patent Application No. 62/305,454 filed Mar. 8, 2016.

BACKGROUND OF THE INVENTION

1. Field of the Invention

The invention relates generally to the field of semiconductor fabrication processes. More specifically, the invention relates to an electromagnetic wave irradiation apparatus and a method to bond voids or unbonded areas at the interface of a bonded pair of substrates, which are common defects that may occur in a substrate bonding process. The invention likewise relates to substrate bonding and the downstream manufacturing of electronic and photonic devices.

2. Prior Art

Direct substrate bonding generally refers to a semiconductor process wherein the planar surfaces of chemical-mechanical planarized ("CMP"), smooth and clean substrates of almost any material are brought into contact at room temperature and are locally attracted to each other by a van der Waals force and/or hydrogen bonding force and adhere or bond to each other. Substrate bonding of this type may be known in the semiconductor processing arts as "direct bonding", or "cold welding".

Generally, substrates in a bonding process are semiconductor substrates or wafers consisting of single crystal materials such as silicon, gallium nitride or gallium arsenide as are commonly used in microelectronics or optoelectronics. Unfortunately, bonded substrates that use van der Waals force and/or hydrogen bonding force at room temperature have a bond that is undesirably weak compared to that of covalently- or ionically-bonded materials.

In most direct bonding operations performed at wafer-level for fabrication of micro-electromechanical systems (MEMS), nano-electromechanical systems (NEMS), microelectronics and optoelectronics, surface treatments (e.g., surface planarization, hydration, plasma activation) are conducted prior to substrate surface contact to promote surface attraction and the bonding process. Typically, direct bonding is assisted by compressing the two substrate surfaces together during a direct bonding process. Also, it is not uncommon that one of the two bonded substrates, or both, are back-thinned to a thickness that, depending on the specific application, may be in the range of a few microns ($\mu$m) down to a few nanometers (nm).

Unfortunately, the current state of the art in substrate bonding undesirably results in unbonded areas or bond voids that are introduced or formed at the interface of the substrate active surfaces. These unbonded areas (or voids) may be the result of unwanted particles or contaminants from etching systems, implantations, chemical vapor deposition (CVD), and/or CMP steps or any number of processes. Defective photolithography steps may also result in surface defects, the locations of which remain unbonded at the substrate bond interface. It is vitally important to minimize or preferably eliminate all unbonded regions and bond voids at the substrate/wafer-bonding interface since such unbonded areas may ultimately lead to device failure and low wafer yield.

BRIEF DESCRIPTION OF THE DRAWINGS

The method according to the invention is explained in more detail with reference to the subsequent figures without restricting the method to the illustrated embodiments herein.

Figure 1A:
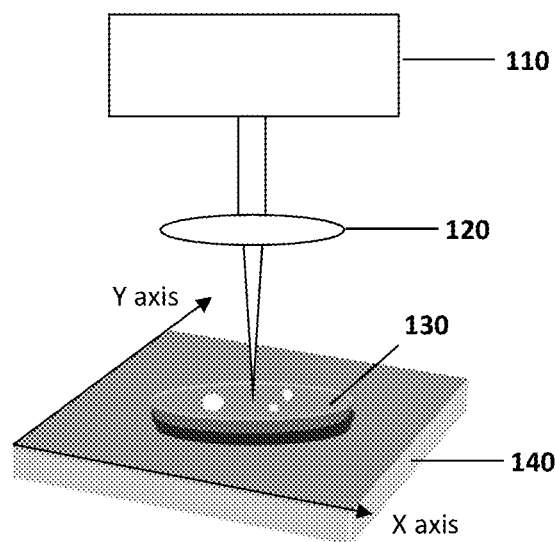
FIG. 1A shows a schematic representation and side view of one embodiment of an apparatus of the invention in which the bonding of substrates is performed using an X-Y stage.

The invention and its various embodiments can now be better understood by turning to the following description of the embodiments which are presented as illustrated examples of the invention in any subsequent claims in any application claiming priority to this application. It is expressly understood that the invention as defined by such claims may be broader than the illustrated embodiments described below.

DETAILED DESCRIPTION OF THE PREFERRED EMBODIMENTS

As used herein, the terms "wafer" and "substrate" may each be referred to as "substrate" and it is understood that the terms may be used interchangeably herein for the sake of brevity. The invention discloses an electromagnetic wave irradiation apparatus and a substrate assembly bonding method that minimizes or eliminates unbonded areas (also referred to as "voids") in a bonded substrate assembly, such as in a direct bonded or cold-welded substrate assembly. The disclosed method can readily be used for materials having a direct bonding step as well as for materials with different thermal expansion behaviors while still achieving high bonding strength between the substrate pairs at the interface.

According to one aspect of the invention, a method to remove unbonded areas in a bonded substrate interface by electromagnetic wave irradiation is provided in which two substrates are bonded in a first process step using van der Waals and/or hydrogen bonding forces by bringing them into direct contact, which step may further comprise using compression or force to mechanically urge the two substrate surfaces together during the bonding process. Using the disclosed method, unbonded regions are eliminated and bonded by becoming thermally active in the unbonded regions by means of the induced electromagnetic wave irradiation on the bonded pairs. Beneficially, multiple pairs of substrates can all be processed in same apparatus according to the described method.

In one aspect of the method of the invention, the elimination of unbonded areas is accomplished by thermal activation that is induced by incident electromagnetic wave irradiation on the substrate surface; the electromagnetic wave energy preferably selected according to criteria such that there is no adverse phase change or adverse transformation of substrate material during thermal activation. As a result of the fact the melting temperature of the substrate material is not reached in the described process, the original profile of the surface of the substrates is thus maintained.

Using the method of the invention, no adverse material phase transition occurs and the supplied electromagnetic wave energy at the unbonded areas is converted into phonon (or electron) excitation of the substrates which absorb the selected electromagnetic wave on its wavelength (hc/$\lambda_a$>$E_g$), where h is the Planck's constant, c is the speed of light, $\lambda_a$ is the wavelength of the electromagnetic wave, and $E_g$ is a bandgap of a material of a substrate (e.g., the substrate being irradiated).

Using optimized electromagnetic wave energy, the absorbed energy is used to thermally activate and bond the substrate causing the elimination of the unbonded areas. The wavelength of the electromagnetic wave irradiation is preferably selected as above and the focusing of the electromagnetic wave irradiation is selected such that either only the top substrate or both top and bottom substrates are irradiated to activate the elimination of the unbonded areas.

Each of the substrates may be amorphous, partly-crystalline and/or crystalline materials. Precise focusing of the electromagnetic wave beam on the substrates is preferred but not necessary. The activation of the unbonded areas may be adjusted via many process parameters, such as varying electromagnetic-wave focusing, electromagnetic wave intensity, or spot size of the irradiation beam, etc. Several electromagnetic waves with different wavelengths can also be used in the method of the invention, some or all of which may be shorter than the assigned wavelength $\lambda_a$ (hc/$\lambda_a$>$E_g$).

Control of the resultant energy impinged on the substrates may be effected via suitable selection of focusing, wavelength and beam size. The phonon transition, and hence the energy diffusion at the beam location, thereby depends largely upon the electromagnetic wave power.

There is no restriction on substrate type or material to practice the method of the invention. Substrates used may be amorphous or crystalline materials and may be selected from the group including polymers, metals, glasses, ceramics and semiconductors. Other substrate coating/deposited materials may comprise those from amorphous materials, partially-crystalline or crystalline materials, in particular silicon dioxide, silicon nitride, semiconductors, optic crystals, and plastic materials. Crystalline substrates are preferably selected from the group consisting of semiconductors, ceramics, piezo-ceramics, or single crystals.

Among semiconductors, silicon, germanium, indium phosphide, gallium arsenide, aluminum gallium arsenide, gallium antimonide, indium arsenide, aluminum nitride, or gallium nitride are for use in the method of the invention in various embodiments.

Non-linear crystals, in particular lithium triborate, barium diborate, lithium niobate, or potassium titanyl phosphate may also be used in the method of the invention.

Plastic materials can also be used as substrates in the method of the invention, specifically copolymers or cycloolefins, polycarbonate, or polymers, and polymethacrylate, and also composite materials thereof.

The method according to the invention is well-suited for any two substrates that are bonded in bonding operation. Specifically, substrates with different thermal coefficients of expansion can be used though two substrates used in the method may also be of the same materials.

Figure 2:
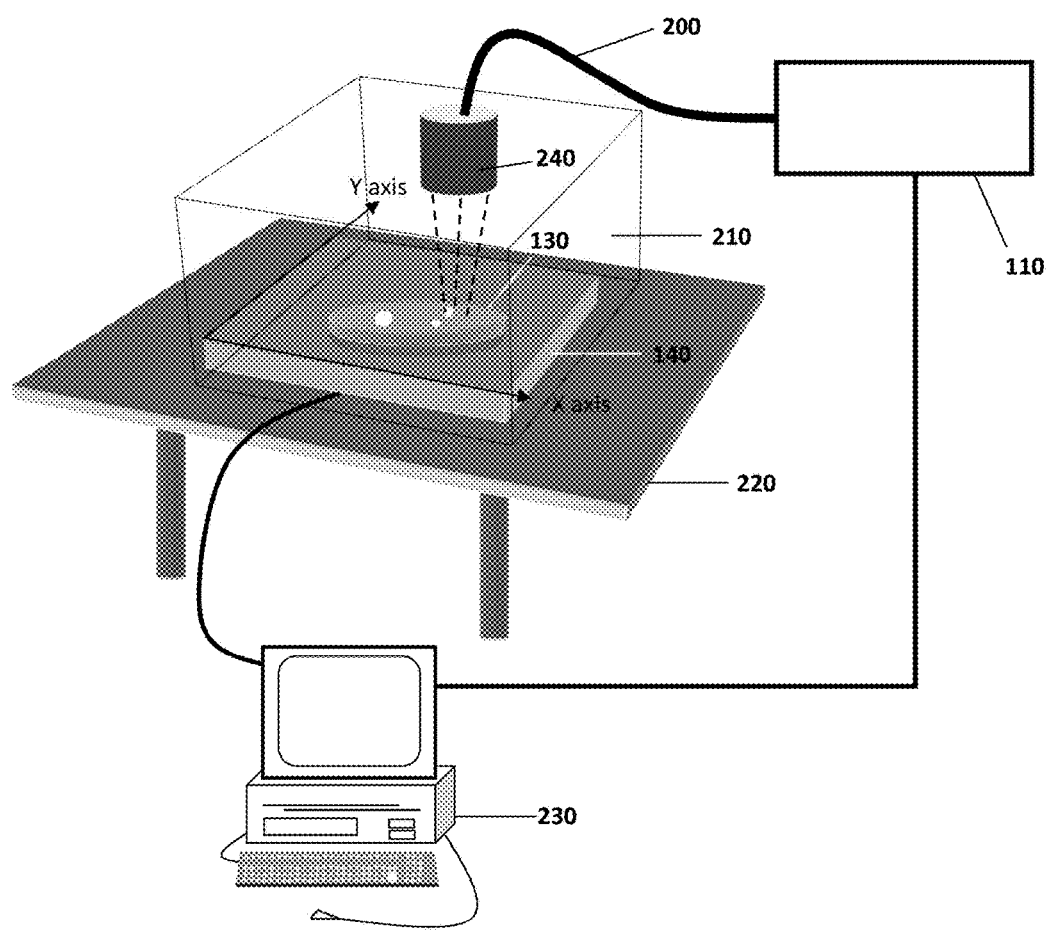
FIG. 2 shows a schematic drawing of an alternate embodiment of the apparatus of the invention.

The elimination of the unbonded areas may take place in an integrated construction (as shown in FIG. 2) in which the electromagnetic wave irradiation step of the invention is performed. The integrated construction may also be performed in other fabrication environments at this step, such as in a vacuum or under a protective gas. Thermal absorption processes of this type are beam intensity-dependent, which in turn is dependent on EM beam-focusing conditions or the intensity of the electromagnetic wave irradiation.

The following descriptions illustrate embodiments of the bonding substrates discussed in this invention. Preparation of substrates with respect to the planarity of their surfaces can, if not provided from the initial situation of the preparation process, be reached for instance by using known processing and cleaning steps to reduce roughness and particle contaminations on the substrate surfaces. Substrate pre-treatment steps may be as follows but are not limited to, for instance, oxide layer deposition, CMP, plasma activation of the substrates surface, de-ionized water rinse, and adsorption of functional groups, e.g., $NH_2$ and OH on the interface surfaces of the substrates to be bonded.

In one embodiment of the invention, bonding is performed by known direct bonding processes using process steps of CMP, cleaning of the substrates, plasma activation and alignment of the substrate surfaces and compression of the substrates one upon the other during the direct bonding step. All the pre-treatment steps shown in FIG. 3 may be performed in any sequence. The methods of this invention also apply to aligned bonding in which certain features of the substrate surface need to be in accurate alignment prior to bonding.

An alternative embodiment of an application according to the invention relates to "hybrid material integration" wherein different materials are bonded to be functionalized as a single unit. For example, elimination of unbonded areas generated from the bonding of silicon (microelectronic), and GaAs, or GaN (optics), which are the optoelectronic components, and further bonding with structured elements made of glass or transparent plastic material (micro-lens arrays) are subsumed within the term of "hybrid material integration".

Turning now to the figures wherein like references define like elements among the several views, a device and method for providing a bonded substrate with a reduced or eliminated unbonded interface surface are disclosed.

As general background of the method of the invention, when an electromagnetic radiation wave impinges on an absorbing substrate in a bonded pair of substrates, the electromagnetic radiation is converted into thermal energy locally on the substrate surface. The thermal energy is conducted through the absorbing substrate in all directions based on the thermal and crystallographic characteristics of the absorber. Some of this thermal energy will propagate to the bonding interface.

For fully-bonded regions at the interface of the bond of the substrate pair, the thermal energy reaching the interface continues to propagate through the material without adversely affecting the material or device characteristics while desirably retaining the intended function of the substrate pair. The average temperature of the bonded substrates is low even as the local temperature may rise to be several hundred degrees Celsius, and the heat dissipates quickly, decreasing the risk of thermal damage to adjacent structures or the substrates themselves. It is noted that local temperatures achieved in the process of the invention can be greater than those to which an oven-annealed bonded substrate pair are normally exposed in prior art annealing processes.

Figure 1B:
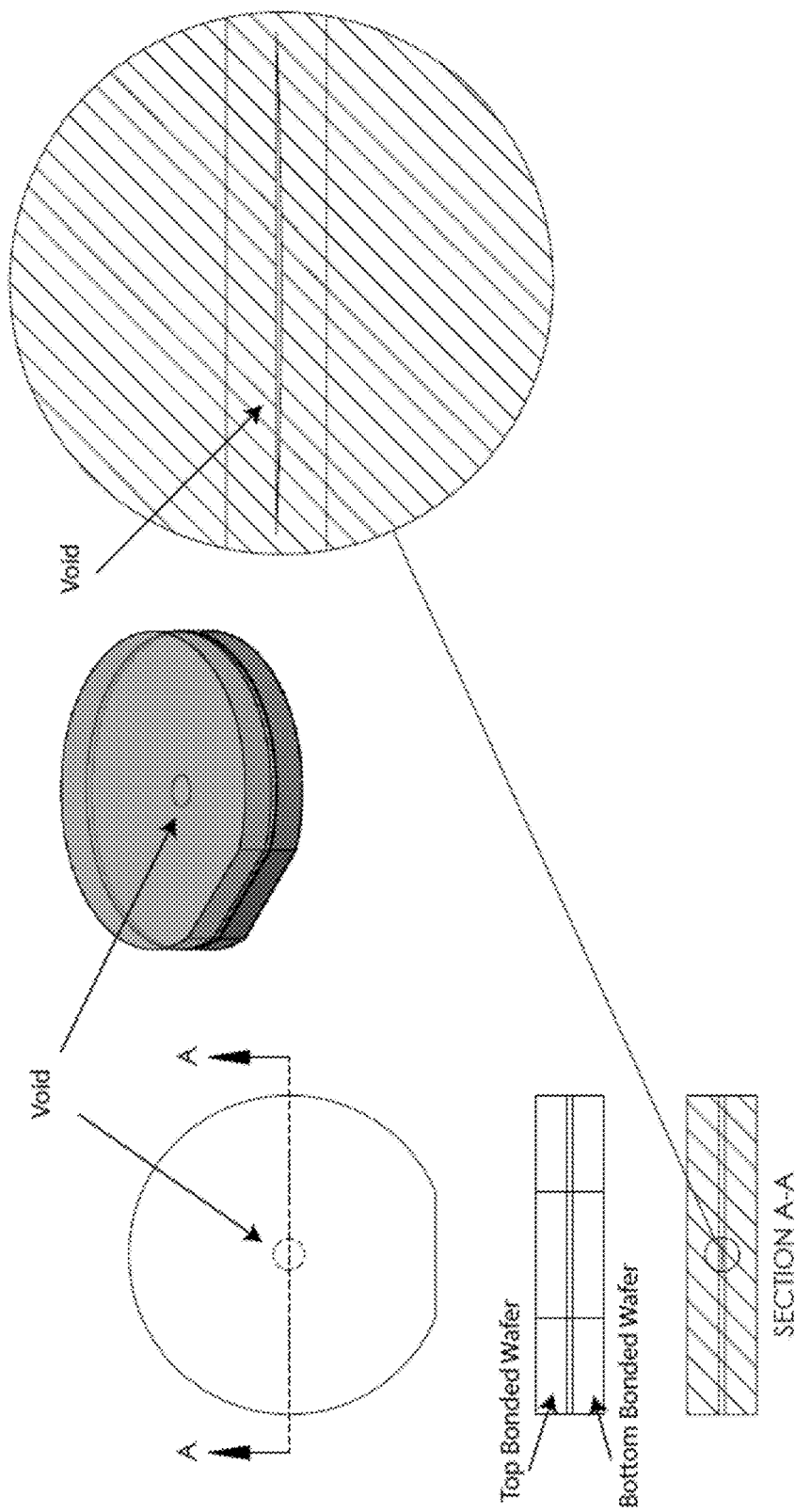
FIG. 1B depicts a bonded substrate pair having an unbonded region or void at the interface of the two substrates.
Figure 1C:
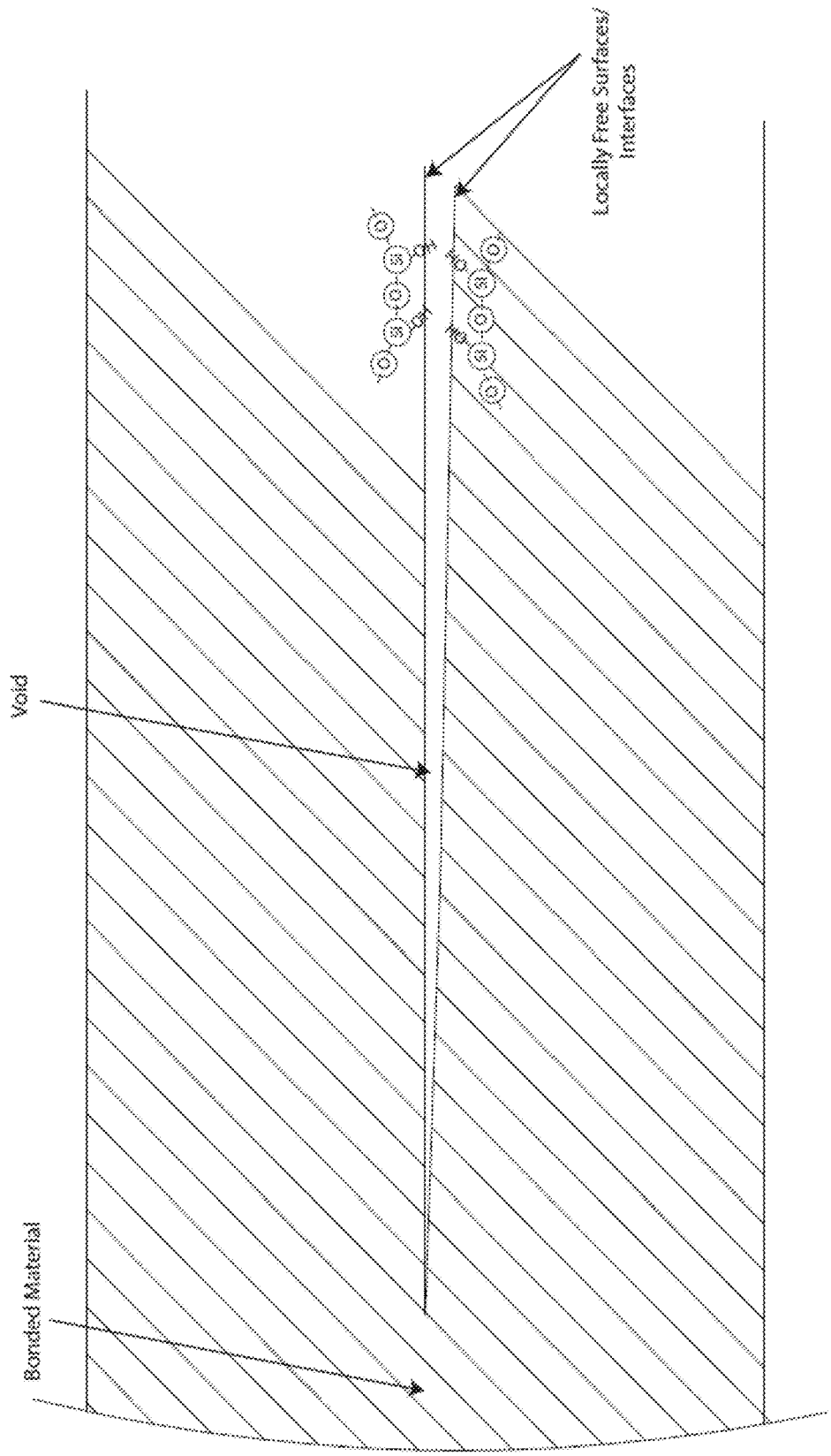
FIG. 1C depicts a bonded substrate pair having an unbonded area or void and a locally free interface.

As best seen in FIGS. 1A-C, for partially-bonded wafer regions or areas affected by voids at the interface of the bonded substrate pair, the induced thermal energy alters the local chemical structure at the bonding interface where the void is present. Generally, the voids are visible to the naked eye. However, in some embodiments a microscope, for example a scanning acoustic microscope that generates sound wave to detect a change in density within an object, may be used to detect the location of the voids within the bonded substrate pair. In some embodiments, the size of the voids may be an order of 5 mm.

For oxide-based fusion bonding, the two bonding interfaces are populated predominantly with hydroxide (OH—) groups bonded to Si atoms that can be thought of as being non-parallel by a small angle. In some embodiments, one or both surfaces to be bonded may be populated or supplemented in a separate operation to have a predetermined OH— group density.

These interfaces have a certain surface energy associated with each that is eliminated if the interfaces can be stitched together chemically. The origin of the non-parallelism may come from a variety of sources, but the important point is that during the original bond press or annealing, there was not sufficient mechanical or thermal energy delivered to the unbonded region to trigger the dehydration reaction that is necessary to seal and bond the void that resulted in the unbonded region.

Particularly with respect to prior art bonding processes in which the thermal expansion coefficients of the two substrates to be bonded are mismatched, the maximum average temperature to which the bonded substrates can be subjected is limited and excessive temperatures can cause failures of the bonds due to strain build up across the substrate interface that would cause substrate shifts, cracking, etc.

In the infrared (IR) annealing approach of the invention, the local temperature at the void's bonding interface is elevated well above what would be allowable for oven annealing without distorting the bonded pair macroscopically. The higher thermal energy input of the incident electromagnetic wave in the method having a sufficient flux that causes the OH— groups on opposite sides of the bonding interface to interact and dehydrate, forming Silicon-Oxygen-Silicon (Si—O—Si) bonds and thus liberating $H_2O$ that diffuses through the substrates until it is absorbed or escapes at the free edges of the bonded wafer pair.

The void elimination proceeds from the inner edge of the void (closest to the center of the substrate) towards the center of the void and continuing to the outer edge of the void using the electromagnetic (EM) scanning method of center-out radial laser rastering of the invention.

The "zipping up" of the void using the method of the invention is a consequence of the system's desire to reduce its free surface energy, and is kinetically enabled by localized heating of the bonding interfaces to high enough temperatures such that the mechanical gap between the interfaces is overcome and the angle between the interfaces decreases as the void elimination process progresses and the void diameter decreases.

The step of focusing electromagnetic wave irradiation is illustrated schematically in FIG. 1A, with the electromagnetic wave irradiation being focused on unbonded areas at the interface between the bonded substrates.

FIGS. 1A-C depict an embodiment of the apparatus and method of the invention in which the elimination of unbonded areas of FIGS. 1B and 1C can be performed.

In FIG. 1A, X-Y or scanning stage 140 is a moving stage, which may comprise an X-axis motor assembly and Y-axis motor assembly. The X-Y stage 140 controls the in-plane movement (X- and Y-axis movement) of the materials (e.g., bonded substrates 130) on the stage. The localized thermal activation of bonded substrates 130 with unbonded areas is thus controlled by moving the X-Y stage 140. Vertical or Z-axis movement may be controlled using mechanical, electro-mechanical, piezoelectric, pneumatic or equivalent actuation means, which may be used to control the position of optical component 120 (e.g., optical or magnetic lens, micromirror device) to focus the electromagnetic wave beam or light generated by electromagnetic wave source 110. In addition, the Z-axis movement may also be controlled by a motor assembly to possibly use in adjusting the focus depth of the electromagnetic wave irradiation (e.g., pulsed or continuous wave irradiation) on unbonded areas at the interface between the bonded substrates 130. In some embodiments, the beam size of the electromagnetic wave beam is 5 µm, 5 millimeters (mm) or 10 mm.

Bonded substrates 130 are located on the X-Y stage 140. The focusing of the electromagnetic wave irradiation may be selected using a mechanical controller, or electro-mechanical, piezoelectric, pneumatic or equivalent positioning means on the Z-axis, and the electromagnetic wave irradiation is thus subsequently focused only on the substrates on the stage. The electromagnetic wave may be generated for example using lasers in any wavelength, including, without limitation, visible light, IR, ultraviolet (UV), microwave, radio frequency electromagnetic wave or X-ray. In some embodiments, working in conjunction with the X-Y stage 140, the optical component 120 may direct the electromagnetic wave beam to a surface of the bonded substrates 130 to generate a scan pattern on the surface of the bonded substrates 130. In some embodiments, the scan pattern may comprise a circle, raster, or spiral pattern.

Referring to FIG. 1A, an electromagnetic wave beam generated by the electromagnetic wave source 110 is focused and directed through the optical component 120. The optical component 120, with guidance of the X-Y stage 140, directs, guides and focuses the electromagnetic wave beam onto a major planar surface of the bonded substrates 130, the thickness of which comprises the interface between the bonded substrates 130 having unbonded areas or voids, as illustrated in FIGS. 1B-C. The electromagnetic wave beam generates heat locally on a surface of the bonded substrates 130 to propagate heat for conduction through one substrate to the other substrate within the bonded substrates 130, with thermal energy from the electromagnetic wave beam being absorbed by the bonded substrates 130 at the unbonded areas. The thermal energy has sufficient flux to cause, for example, an OH— group on each of the bonded substrates 130 to interact and dehydrate to form, for example, an Si—O—Si bond at the unbonded areas, thereby eliminating the unbonded areas or voids.

The exemplar electromagnetic wave irradiation set-up illustrated in FIG. 1A is compatible with many set-ups commonly found in semiconductor fabrication, for example, as is used in the Complementary Metal Oxide Semiconductor (CMOS) process. Therefore, the invention can be performed using automatically loading and unloading robotics for faster throughput to reduce the cost of the fabrication process.

FIG. 2 shows an alternate embodiment of an apparatus that may be used for the elimination of an unbonded region within a pair of bonded substrates.

FIG. 2 comprises an electromagnetic wave source 110, an optical fiber 200, an optical microscope 240, bonded substrates 130, and an X-Y stage 140 which may be located on a vibration-free table 220 to provide a vibration-free environment, and is movable in two dimensions under control of a computer 230. In some embodiments, the optical microscope 240, bonded substrates 130, and X-Y stage 140 may be enclosed within an optical protection box 210, for example, to contain the electromagnetic wave and prevent potential hazard. Generally, the optical protection box 210 is provided for safety concern and has no effect on the unbonded areas elimination process.

In some embodiments, the electromagnetic wave source 110 may be a Coherent Highlight fiber array package (FAP) diode laser system. Laser power ranges may be from about 0.005 W to about 60 W, at a wavelength of about 810 nm, with a focusing beam of about 0.8 mm in diameter. The scanning rate of the laser may be about 4 mm/s and the overlap of the stepped electromagnetic wave beam may be about 0.5 mm.

The computer 230 is connected to the laser, for example, through the serial port controls and programs the laser using suitable manufacturing programmable interface software.

Optical microscope 240 may comprise optics configured for laser beam guidance and focusing. Optical microscope 240 allows the laser beam to be precisely focused on the bonded substrates 130, which are located on the X-Y stage 140. X-Y stage 140 moves the bonded substrates 130 during the process of removing the unbonded areas.

X-Y stage 140 may comprise a pre-vision computer controlled stage, with a capability of sub-micron positioning of micrometer targets on X-Y stage 140.

As best shown in FIG. 2, X-Y stage 140 comprises an X-axis assembly motor, a Y-axis assembly motor, all controlled by computer 230. Computer 230 is configured to control X-Y stage 140.

Using the apparatus described in FIG. 2, the electromagnetic wave irradiation can be performed in an ordinary room environment. Vacuum conditions or a clean room environment are not required for the elimination of the unbonded areas using the electromagnetic wave irradiation. Additionally, no extra heating assembly is needed. In some embodiments, pressure may be applied to a surface of the bonded substrates 130, for example to facilitate the unbonded areas elimination process, without interfering with application of the electromagnetic energy.

Figure 3:
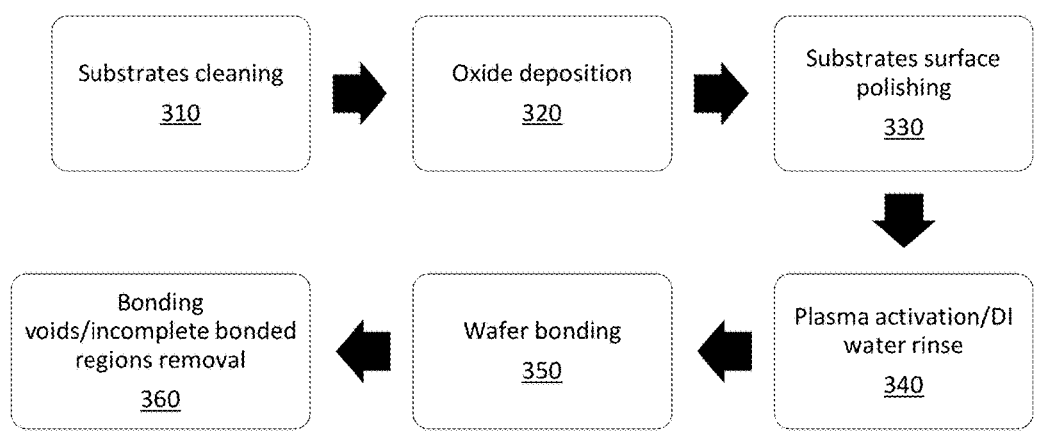
FIG. 3 shows a process to prepare substrates for bonding and electromagnetic wave irradiation in accordance with aspects of the invention.

FIG. 3 illustrates a process to prepare substrates for bonding and electromagnetic wave irradiation in accordance with aspects of the invention. At block 310, the process performs substrates cleaning. For example, a pair of substrates or silicon wafers to be bonded may be cleaned by a solvent clean or RCA clean to remove organic and/or ionic contaminants. At block 320, the process performs oxide deposition. For example, plasma-enhanced chemical vapor deposition (PECVD) may be used to deposit films from vapor to a solid state on the substrates. The films, for example, may be used as insulating layers in metal-insulator structures, such as integrated circuits and multichip modules. At block 330, the process performs substrates surface polishing (e.g., CMP polishing) to remove, for example, unwanted conductive or dielectric materials on the surfaces of the substrates and achieve a near-perfect flat and smooth surface upon which layers of integrated circuitry may be built. At block 340, the process performs plasma activation, for example to improve surface adhesion properties of the substrates, and deionized (DI) water rinse on the surface of the substrates. At block 350, the substrates are bonded together using, for example, van der Waals force and/or hydrogen bonding force and adhere or bond the substrates to each other. At block 360, bonding voids or incomplete bonded regions at the interface of the pair of bonded substrates are removed, for example, using the techniques as discussed in FIGS. 1 and 2. The methods of the invention also apply to aligned bonding in which certain features of the substrate surface need to be in accurate alignment prior to bonding.

Figure 4:
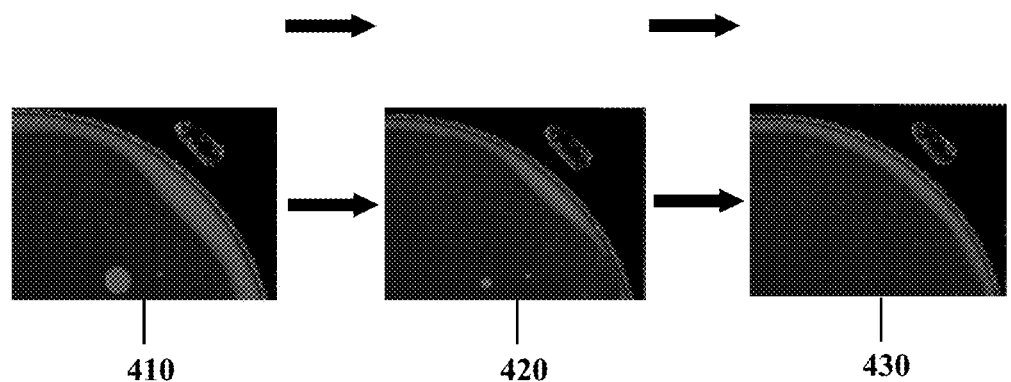
FIG. 4 is an illustration of a process for elimination of unbonded areas with illustrative sonoscan images of bonded substrates with the electromagnetic wave irradiation process to remove unbonded areas in accordance with aspects of the invention.

FIG. 4 is an illustration of a process for elimination of unbonded areas with illustrative sonoscan images of bonded substrates with the electromagnetic wave irradiation process to remove unbonded areas in accordance with aspects of the invention. In image 410, the lateral size of the unbonded areas is large (e.g., an order of 5 mm) as electromagnetic wave irradiation has not been applied to the bonded substrates. In image 420, the lateral size of unbonded areas is partially-reduced during the initial electromagnetic wave irradiation process, and eventually removed by the electromagnetic wave irradiation, as shown in image 430. A predetermined threshold of electromagnetic wave intensity is used in the elimination process, e.g., 50 W.

It has been determined that unbonded areas can be removed by the electromagnetic wave irradiation using lower electromagnetic wave intensity, while the unbonded areas can expand if the electromagnetic wave intensity is above the threshold. This threshold of the electromagnetic wave intensity varies depending on the different substrate materials used in this process as is readily determined by those skilled in the semiconductor fabrication arts.

A scan pattern for exposing the substrate using electromagnetic wave may comprise a circle, raster, or spiral pattern.

While various embodiments of the instant invention may utilize relatively narrow-band laser irradiation sources, an alternative irradiation source may comprise a focused broadband irradiation source selected whereby the substrate material can sufficiently absorb the selected band of radiation.

The irradiation source may also comprise an incoherent, broad spectrum source. As is known, a laser source does not emit at a single frequency; but rather at a dominant frequency/wavelength with stray wavelengths impinging on the surface as well that can contribute to the annealing process of the invention.

The radiation source is not required to have an energy greater than the substrate material band gap to be absorbed. There may be mid-gap states or inter-sub band absorption can occur. So long as the radiation can be absorbed by the substrate in a manner that results in phonon generation, the localized annealing function of the invention is enabled.

In a yet further alternative embodiment, fusion bonding with silicon nitride instead of silicon dioxide as the bonding material is enabled. In such instance, the substrate surfaces to be bonded may be populated with hydrogen ions, and evolve ammonia (NH3) during the dehydration process resulting in a bonding of an unbonded region of a pair of substrates. The method of the invention contemplates an embodiment in which silicon nitride bonding of layers is accomplished in which —$NH_2$ radicals are excited by an irradiation source and removed.

Many alterations and modifications may be made by those having ordinary skill in the art without departing from the spirit and scope of the invention. Therefore, it must be understood that the illustrated embodiment has been set forth only for the purposes of example and that it should not be taken as limiting the invention as defined by any claims in any subsequent application claiming priority to this application.

For example, notwithstanding the fact that the elements of such a claim may be set forth in a certain combination, it must be expressly understood that the invention includes other combinations of fewer, more or different elements, which are disclosed in above even when not initially claimed in such combinations.

The words used in this specification to describe the invention and its various embodiments are to be understood not only in the sense of their commonly defined meanings, but to include by special definition in this specification structure, material or acts beyond the scope of the commonly defined meanings. Thus, if an element can be understood in the context of this specification as including more than one meaning, then its use in a subsequent claim must be understood as being generic to all possible meanings supported by the specification and by the word itself.

The definitions of the words or elements of any claims in any subsequent application claiming priority to this application should be, therefore, defined to include not only the combination of elements which are literally set forth, but all equivalent structure, material or acts for performing substantially the same function in substantially the same way to obtain substantially the same result. In this sense, it is therefore contemplated that an equivalent substitution of two or more elements may be made for any one of the elements in such claims below or that a single element may be substituted for two or more elements in such a claim.

Although elements may be described above as acting in certain combinations and even subsequently claimed as such, it is to be expressly understood that one or more elements from a claimed combination can in some cases be excised from the combination and that such claimed combination may be directed to a subcombination or variation of a subcombination.

Insubstantial changes from any subsequently claimed subject matter as viewed by a person with ordinary skill in the art, now known or later devised, are expressly contemplated as being equivalently within the scope of such claims. Therefore, obvious substitutions now or later known to one with ordinary skill in the art are defined to be within the scope of the defined elements.

Any claims in any subsequent application claiming priority to this application are thus to be understood to include what is specifically illustrated and described above, what is conceptually equivalent, what can be obviously substituted and also what essentially incorporates the essential idea of the invention.

What is claimed is:

1. A method for eliminating an unbonded region of a partially-bonded substrate pair, the method comprising:
   generating, by an electromagnetic wave source, an electromagnetic wave beam having a wavelength; and
   focusing, by an optical component, the electromagnetic wave beam from the electromagnetic wave source onto a surface of a first substrate or a second substrate to generate thermal energy locally on and irradiate the surface, the first substrate being partially-bonded to the second substrate forming a bonded substrate pair and defining at least one unbonded region at a bond interface of the bonded substrate pair;
   whereby the thermal energy from the irradiated surface is transferred to the bond interface and the unbonded region at the bond interface and further through to the non-irradiated substrate to cause a phonon or electron excitation of the first and second substrates that absorb the thermal energy, the absorbed thermal energy activating the first and second substrates causing opposite sides of the unbonded region to form one or more bonds, thereby eliminating the unbonded region.

2. The method of claim 1, further comprising:
   controlling movement of the bonded substrate pair by a stage while focusing the electromagnetic wave beam onto the surface of the at least one of the first substrate and second substrate so as to generate a scan pattern on the surface, wherein the stage is configured to hold the bonded substrate pair.

3. The method of claim 2, further comprising:
   directing, by an optical fiber, the electromagnetic wave beam from the electromagnetic wave source into the optical component.

4. The method of claim 2, wherein the stage comprises a first motor assembly and a second motor assembly that control in-plane movement of the bonded substrate pair on the stage, and control localized thermal activation of the bonded substrate pair.

5. The method of claim 4, wherein the first motor assembly and the second motor assembly are coupled to a computer configured with software for controlling the first and second motor assemblies.

6. The method of claim 4, wherein the stage further controls vertical movement of the bonded substrate pair on the stage.

7. The method of claim 2, wherein the scan pattern comprises a circle, spiral, or raster scan pattern irradiation.

8. The method of claim 1, wherein the optical component is an optical lens, a magnetic lens, a micromirror device, or an optical microscope.

9. The method of claim 1, wherein the wavelength is a wavelength of visible light, infrared, ultraviolet, microwave, radio frequency, or X-ray.

10. The method of claim 1, wherein beam size of the electromagnetic wave beam is 5 microns, 5 millimeters or 10 millimeters.

11. The method of claim 1, wherein a ratio between (a) a product of a Planck constant and speed of light, and (b) the wavelength is greater than a band gap of a material of the first substrate or second substrate.

12. A method for bonding an unbonded region of a partially-bonded substrate pair, the method comprising:
    generating electromagnetic radiation having a wavelength;
    focusing the electromagnetic radiation onto a surface of a first substrate or a second substrate to generate thermal energy locally on and irradiate the surface, the first substrate being partially-bonded to the second substrate forming a bonded substrate pair and defining at least one incomplete bonded area at a bond interface of the bonded substrate pair; and
    controlling movement of the bonded substrate pair while focusing the electromagnetic radiation onto the surface so as to generate a scan pattern on the surface;
    wherein the wavelength is selected to effect a phonon or electron excitation within the bonded substrate pair;
    whereby a portion of the thermal energy from the irradiated surface is transferred to the bond interface of the bonded substrate pair and the incomplete bonded area at the bond interface and further through to the non-irradiated substrate to cause the phonon or electron excitation of the first and second substrates that absorb the thermal energy, the absorbed thermal energy activating the first and second substrates causing opposite sides of the incomplete bonded area to form one or more bonds, thereby eliminating the incomplete bonded area.

13. The method of claim 12, wherein controlling movement of the bonded substrate pair comprises controlling in-plane movement of the bonded substrate pair.

14. The method of claim 12, wherein OH— groups on the opposite sides of the interface interact and dehydrate to form the bond(s), wherein the bond(s) is/are Si—O—Si bond(s).

15. The method of claim 12, wherein each of the first and second substrates is amorphous, partly crystalline, crystalline, or a combination thereof.

16. The method of claim 12, wherein the first and second substrates are formed with a different group of materials.

17. The method of claim 12, wherein the first and second substrates are formed with same material.

18. The method of claim 12, wherein a ratio between (a) a product of a Planck constant and speed of light, and (b) the wavelength is greater than a band gap of a material of the first substrate or second substrate.

19. The method of claim 12, wherein a thermal excitation of molecules or atoms of at least one of the first and second substrates is effected in the at least one incomplete bonded area of the bond interface by the generated electromagnetic radiation.

20. The method of claim 12, wherein the electromagnetic radiation is a pulsed or continuous wave radiation.

* * * * *